United States Patent
Lutz

(10) Patent No.: US 8,396,227 B2
(45) Date of Patent: Mar. 12, 2013

(54) METHOD OF DETERMINING THE HARMONIC AND ANHARMONIC PORTIONS OF A RESPONSE SIGNAL OF A DEVICE

(75) Inventor: Josef Lutz, Rohrau (AT)

(73) Assignee: Knowles Electronics Asia PTE. Ltd., Singapore (SG)

( * ) Notice: Subject to any disclaimer, the term of this patent is extended or adjusted under 35 U.S.C. 154(b) by 538 days.

(21) Appl. No.: 12/513,867

(22) PCT Filed: Oct. 16, 2007

(86) PCT No.: PCT/IB2007/054206
§ 371 (c)(1),
(2), (4) Date: May 7, 2009

(87) PCT Pub. No.: WO2008/056285
PCT Pub. Date: May 15, 2008

(65) Prior Publication Data
US 2010/0246840 A1    Sep. 30, 2010

(30) Foreign Application Priority Data
Nov. 8, 2006  (EP) .................................. 06023220

(51) Int. Cl.
*H04R 29/00* (2006.01)
*G01R 23/20* (2006.01)
(52) U.S. Cl. ........................ 381/59; 324/623; 702/112
(58) Field of Classification Search .................. 381/58, 381/59, 97; 324/617, 620, 622, 623, 624; 375/231; 702/108, 109, 112
See application file for complete search history.

(56) References Cited

U.S. PATENT DOCUMENTS
2003/0187636 A1    10/2003  Klippel et al.

FOREIGN PATENT DOCUMENTS
JP    01151400 A  *  6/1989
WO   02/25997 A1    3/2002

OTHER PUBLICATIONS

S. Muller and P. Massarani, "Transfer-Function Measurement with Sweeps," J. Audio Eng. Soc., vol. 49, issue 6, pp. 443-471 (Jun. 2001).*

* cited by examiner

*Primary Examiner* — Yuwen Pan
*Assistant Examiner* — Kile Blair
(74) *Attorney, Agent, or Firm* — Steven McMahon Zeller; Dykema Gossett PLLC

(57) ABSTRACT

A method of determining the harmonic and anharmonic portions of a response signal (RS) of a device (2), e.g. an electro-acoustic or electric device, comprises the steps of supplying an input signal (IS) to the device (2) causing the device (2) to respond with a response signal (RS), wherein the input signal (IS) is a sinusoidal signal having a continuously increasing or decreasing frequency (f), capturing the response signal (RS), transforming the captured response signal (RS) from the time space into the phase space and analyzing the phase space transformed response signal (TRS) in respect of its harmonic and/or anharmonic portions or establishing reference functions when defining the input signal (IS) and analyzing the response signal (RS) by Fourier transformations carried out by numerical integrations of the reference functions.

10 Claims, 2 Drawing Sheets

METHOD OF DETERMINING THE HARMONIC AND ANHARMONIC PORTIONS OF A RESPONSE SIGNAL OF A DEVICE

FIELD OF THE INVENTION

The invention relates to a method of determining the harmonic and anharmonic portions of a response signal of a device, e.g. an electro-acoustic or electric device, comprising supplying an input signal to the device causing the device to respond with a response signal, wherein the input signal is a sinusoidal signal having a continuously increasing or decreasing frequency.

The invention further relates to a computer program product directly loadable into the memory of a programmable device, like a digital signal processor, comprising software code portions for performing the steps of a method according to the first paragraph when said product is run on the device.

The invention further relates to a programmable device, like a digital signal processor, being adapted to process the computer program product mentioned in the above paragraph.

BACKGROUND OF THE INVENTION

In various technical applications, like in quality control, the transfer function of a technical component or of a technical device, like an electro-acoustic device, such as an electro-acoustic transducer, must be determined as a function of frequency.

Generally, a transfer function is a mathematical representation of a relation between the input and output of a system. The transfer function is commonly used in the analysis of single-input single-output electro-acoustic device or analog electronic circuits, for instance. In its simplest form for continuous-time input signal x(t) and output y(t), the transfer function is the linear mapping of the Laplace transform of the input, X(s), to the output Y(s)):

$$Y(s)=H(s)X(s)$$

or $$H(s)=Y(s)/X(s)$$

where H(s) is the transfer function of a linear, time-invariant system.

In order to determine the transfer function, an appropriate input signal has to be provided to the component or device causing the component or device to respond with a response signal. If the input signal is assumed to be a pure sine, the response signal can roughly be divided into three fundamentally different portions:

a) a sine function of the same frequency as the input signal,
b) an harmonic portion (sine functions having an integral multiple of the frequency of the input signal),
c) an anharmonic portion (the remainder of the signal after subtracting components a and b).

It is known to determine the portions a) and b) of the response signal, i.e. the sine function and the harmonic portion, by using a Fourier transform or similar mathematical algorithms. These algorithms require an input signal with a constant frequency. Thus, "stepped" sine signals are used as input signals for determining the frequency dependency of said portions of the response signal. These stepped sine signals have a constant frequency during a certain time period. Then the frequency is switched to the next frequency value to be analyzed within a short switch time (leap).

In principle, portion c) of the response signal, i.e. the anharmonic portion, can be determined by subtracting the determined signal portions a) and b) thereafter. This approach, however, involves a very high calculation effort, since also the phase positions have to be determined precisely and major errors occur when the sampling rates of the response signal are not much higher than the frequencies to be analyzed. In case of technical components which have characteristic frequencies in the transmission route, the said leaps in the input signal arising when the sine signal is switched to another frequency can, in addition, result in an excitation of these characteristic frequencies, which will then be wrongly interpreted as an anharmonic portion of the input signal.

In many cases (e.g. during acoustic measurements of loudspeakers), it is sufficient to determine the anharmonic portions within a frequency band which does not include the frequency of the input signal. An average amplitude or the energy content of the signals in said frequency band constitutes a good index of the quality of the transfer function and can easily be determined by means of known algorithms such as, for example, simple filters or a Hilbert transform etc. In this way, the calculation time can be substantially reduced.

In order to avoid the excitation of resonances in the transmission route by leaps in the input signal (at least the first and second derivations of the input signal should be continuous), it is known to use an input signal whose frequency continuously increases or decreases with time (a so called "Chirp" signal—in acoustics, a logarithmic function is often used for this purpose).

The described known approaches result in two simple methods for determining the portions, however, two different measuring operations have to be carried out. Because of applying two different measuring operations and due to the stepped signal which causes long transient times, the measuring time is extremely long.

From document WO 02/25997 A1 a method of testing an electro-acoustic device is known, wherein a test signal is supplied to the device causing the device to respond with a respond signal. The test signal is preferably a swept or a stepped sine wave signal. The respond signal is captured and analyzed for transients and information is derived from the transients that is indicative of the transients. Analyzing the respond signal involves band pass filtering in one or more distinct frequency bands, rectification of the band pass filtered signals and low pass filtering of the rectified signals. The signals thus analyzed for transients are differentiated. After differentiation the signals represent, in each frequency band, the slope or steepness of the response signal from the device under test, and are a quantitative measure of the presence of possible rub and buzz in the device under test. In quality control of e.g. speaker transducers each of these steepness signals is compared to a predefined threshold value. Only transducers with steepness values entirely below the threshold values are regarded as having passed the quality control test.

The known method, however, suffers from the drawback that the measuring time and calculation effort are extremely high and/or that only a subset of the various portions of the transfer function is determined.

OBJECT AND SUMMARY OF THE INVENTION

It is an object of the invention to provide a method of the type defined in the opening paragraph, in which the disadvantages defined above are avoided. Specifically, it is an object of the invention to provide a method of determining the harmonic and anharmonic portions of a response signal of a device or component wherein, by means of adequate signal processing, the measurement and calculation times are minimized.

In order to achieve the object defined above, a method of determining the harmonic and anharmonic portions of a response signal of a device, e.g. an electro-acoustic or electric device, is provided comprising the steps of:

supplying an input signal to the device causing the device to respond with a response signal, wherein the input signal is a sinusoidal signal having a continuously increasing or decreasing frequency, capturing the response signal, transforming the captured response signal from the time space into the phase space and analyzing the phase space transformed response signal in respect of its harmonic and/or anharmonic portions or establishing reference functions when defining the input signal (IS) and analyzing the response signal (RS) by Fourier transformations carried out by numerical integrations of the reference functions.

In order to achieve the object defined above, furthermore a computer program product is provided being directly loadable into the memory of a programmable device, like a digital signal processor, and comprising software code portions for performing the steps of a method according to the invention when said product is run on the device.

In order to achieve the object defined above, finally a programmable device, like a digital signal processor is provided, which comprises an arithmetic-logic unit and a memory and processes the computer program product according to the above paragraph.

The characteristic features according to the invention provide the advantage that all portions of the response signal are determined in one measuring operation by means of adequate signal processing why the measurement and calculation times are minimized.

In order to be able to analyze the phase space transformed response signal in respect of its harmonic and anharmonic portions by carrying out a Fourier analysis for specific frequency points' it is suggested to define subranges of the phase space transformed response signal wherein the subranges comprise all frequencies between a lower and a higher boundary frequency and wherein a nominal frequency within said subrange is defined being used as a frequency point at which the Fourier analysis is carried out In order to achieve the Fourier analysis with little computational effort yet yielding good results it is further suggested to transform the captured response signal from the time space into the phase space by sampling the response signal at constant time intervals and weighting the sample values with the momentary frequency of the input signal. The Fourier analysis is then carried out with the weighted sample values.

A further reduction of the computational effort can be achieved by allocating nominal frequencies to each subrange of the phase space transformed response signal and carrying out the Fourier analysis of the phase space transformed response signal at said nominal frequencies. A simple nevertheless sufficiently exact approach is to determine the center frequencies between the boundary frequencies of the subranges as said nominal frequencies.

In order to minimize the calculation time it is suitable to establish reference functions for the subranges when defining the input signal. By means of said reference functions the Fourier transformation is deducted to numerical integrations. Numerical integration can be carried out easily when the reference functions are defined as sine functions with integral multiples of the frequency of the input signal. The reference functions can be provided in form of a table.

In order to circumvent the necessity to have to weight the response signal during each measurement, it is suggested to weight the reference functions as they are being established. However, it should be noted that the advantage of this approach will emerge only if several measurements are carried out with the same input signal, i.e. when multiple devices are to be measured, e.g. in quality control testing systems.

It should be observed that the features of the inventive method can be directly implemented in a device or component testing unit, such as a device for testing the quality of electro-acoustic devices.

The aspects defined above and further aspects of the invention are apparent from the exemplary embodiment to be described hereinafter and are explained with reference to this exemplary embodiment.

BRIEF DESCRIPTION OF THE DRAWINGS

The invention will be described in more detail hereinafter with reference to an exemplary embodiment. However, the invention is not limited to this exemplary embodiment.

DESCRIPTION OF EMBODIMENTS

Figure 1:
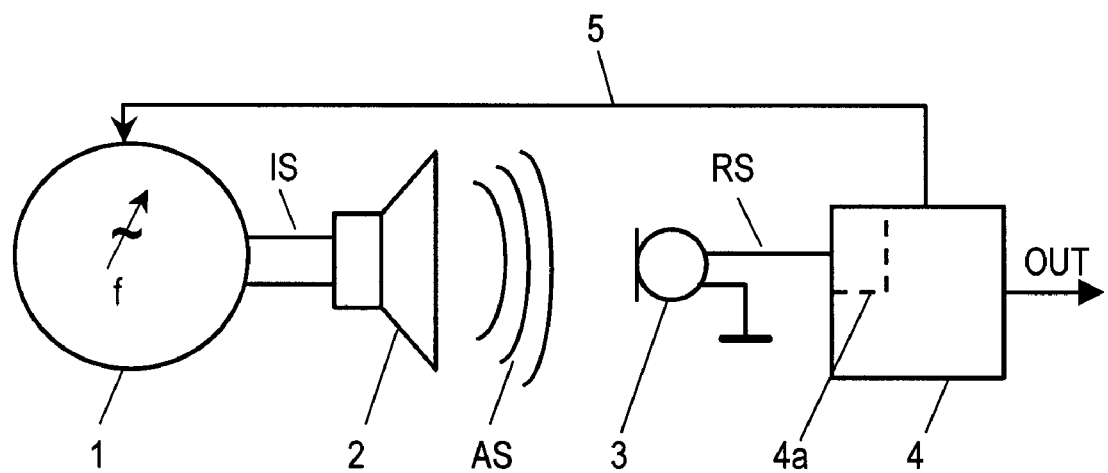
FIG. 1 shows a schematic block circuit diagram of a testing system for testing electro-acoustic transducers, in which testing system the method according to the invention is implemented.

FIG. 1 shows a schematic block circuit diagram of a testing system for testing devices 2 like electro-acoustic transducers. The testing system comprises a signal generator 1 being able to provide at its output terminals an electric sine wave signal whose frequency can be continuously changed. The output terminals of the signal generator 1 are connected to the device 2 to be tested, in the present example an electro-acoustic speaker. The signals generated by the signal generator 2 are supplied as input signal IS to the device 2. The input signal IS causes the device 2 to respond with an acoustic signal AS. This acoustic signal AS is captured by a microphone 3 and is converted into an electric response signal RS. The microphone 3 is a high-quality measuring microphone, so for the purpose of this description it can be regarded as converting the acoustic signal AS into the electric response signal RS without distorting the signal. The response signal RS is fed to a programmable digital signal processor 4 being adapted to carry out the method according to the present invention. The digital signal processor 4 controls the signal generator 1 via a control line 5 in that the digital signal processor 4 controls the amplitude and frequency of the input signal IS. The digital signal processor 4 comprises sampling means 4a for digitally sampling the response signal RS with a constant sampling rate. The result OUT of the digital signal processor may be either the transfer function of the tested device 2 or relevant portions of it, like the harmonic and anharmonic portion, or may e.g. be a signal that indicates whether the device 2 has passed a quality test or not. It should be noted that the transfer function of a speaker should normally have only harmonic portions. Thus, when the analysis of the response signal RS by the digital signal processor 4 yields anharmonic portions it can be assumed that the speaker is defective (e.g. the membrane abuts at a support component of the speaker) and therefore should be discarded or sent to repair.

Figure 2A:
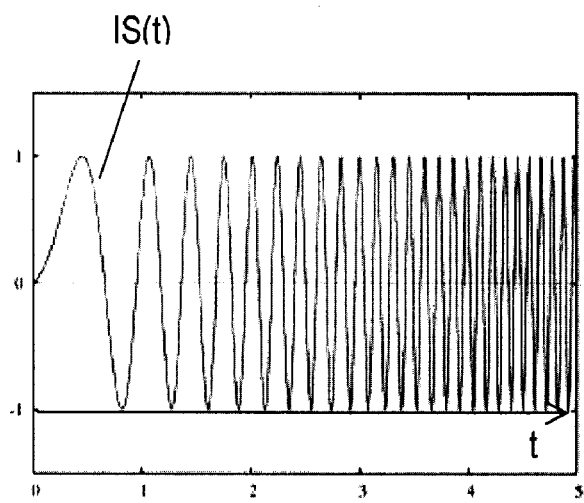
FIG. 2A shows, in the time space, the graph of an input signal having a constant amplitude and a continuously increasing frequency.
Figure 2B:
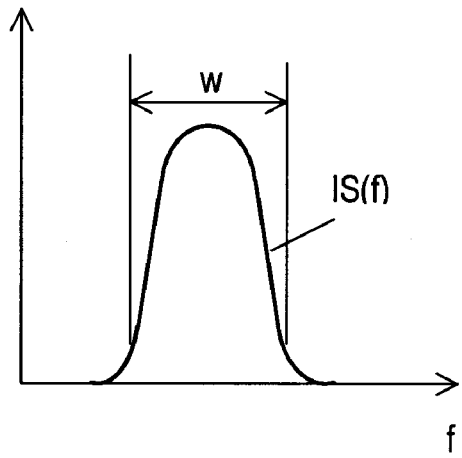
FIG. 2B shows a representation of a portion of the input signal of FIG. 2A in the frequency space.

According to the invention, the input signal IS supplied to the device 2 is a sinusoidal signal having a continuously increasing frequency, a so called "chirp" signal. In FIG. 2A this input signal IS is shown in the time space (graph IS(t)). The graph IS(f) FIG. 2B is a representation of the input signal IS in the frequency space. The width w of the graph IS(f) depends on the frequency increase rate. The faster the frequency changes in a certain time period the wider is width w.

According to the present invention, all components of the response signal RS are to be determined by the digitals signal processor 4, i.e. a sine function of the same frequency as the input signal, a harmonic portion (sine functions having an integral multiple of the frequency of the input signal), and an anharmonic portion.

By supplying the input signal IS having a continuously increasing or decreasing frequency, respectively, the required measurement and calculation times are minimized, since no time is lost for the measurement due to transitions and response times that would occur in case of a stepped sine signal. Since the device 2 to be tested could have some resonances with high Q factors, the frequency change rate of the input signal IS must be low so that said resonances will be visible with the full amplitude. But still, supplying a sinusoidal signal having a continuously increasing or decreasing frequency as input signal IS is preferred over a stepped sine signal, since, in case of the latter, the frequency density must be very high in order to ensure that resonances with high Q factors will reliably be detected. Thus, the expenditure of time for the stepped signal is substantially higher.

Figure 3:
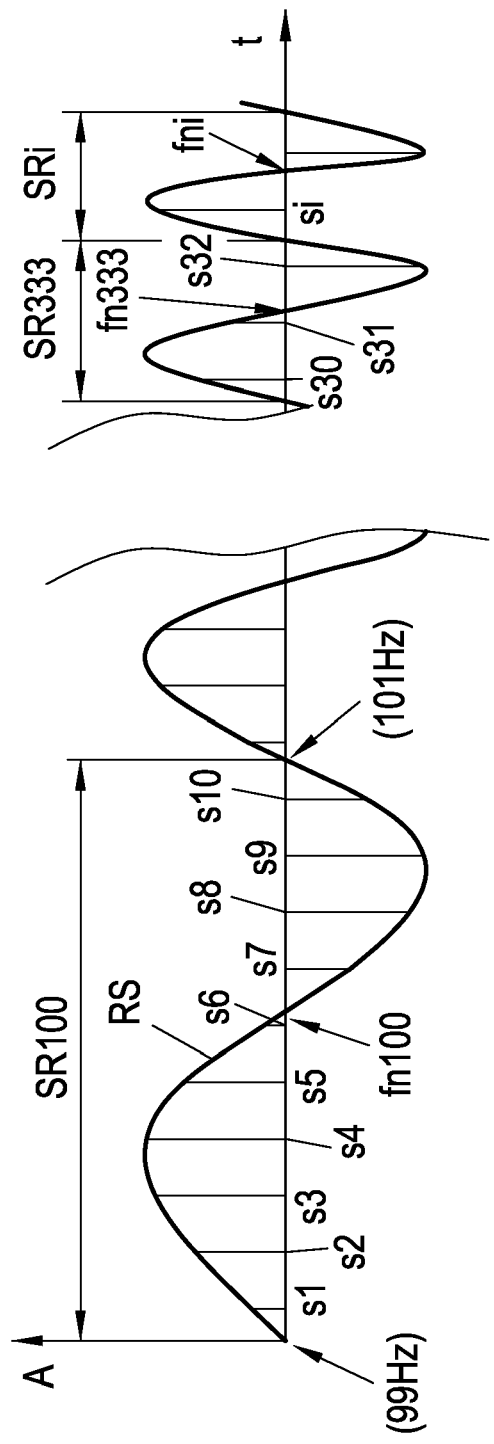
FIG. 3 shows a graph of a response signal in the time space.
Figure 4:
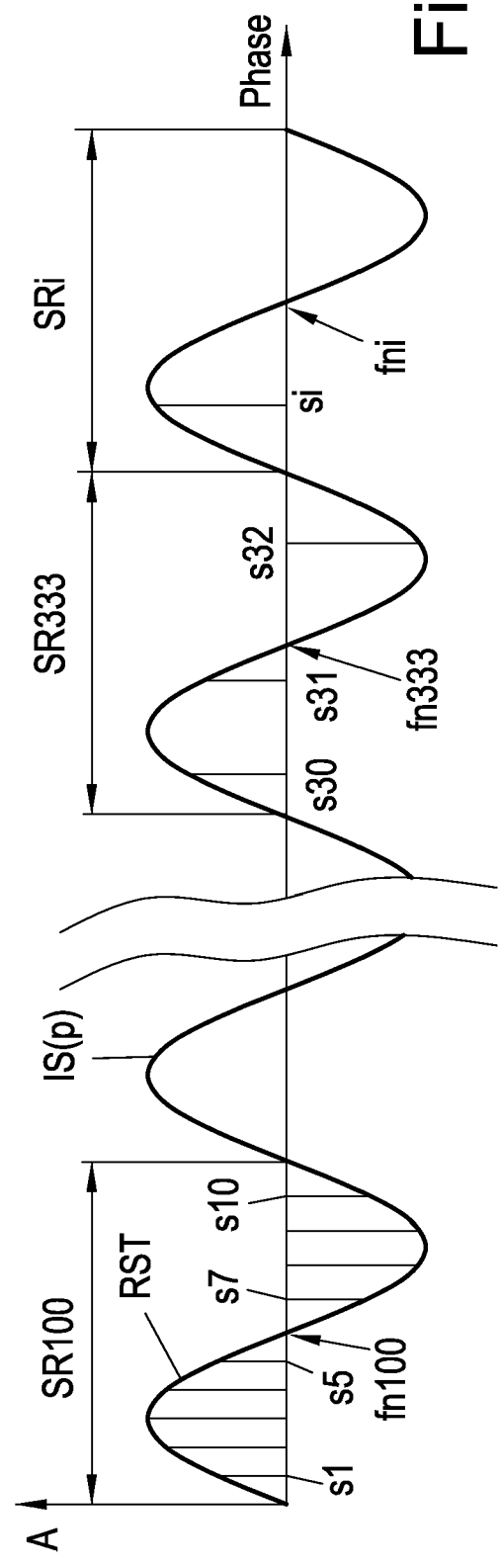
FIG. 4 shows a graph of the transformed response signal of FIG. 3 in the phase space.

Basically, with the provisions made so far, the duration of the measuring operation is minimized and the anharmonic portion of the response signal RS can be determined, but a sine function of the same frequency as the input signal IS and a harmonic portion of the response signal RS can no longer be determined by means of a simple Fourier transform of the response signal RS, due to the continuous frequency changes in the response signal RS. In order to overcome this drawback the invention proposes transforming the response signal RS from the "time space" into the signal's "phase space" as will be now explained by reference to FIGS. 3 and 4. FIG. 3 shows a graph of the response signal RS in the time space, FIG. 4 shows a graph of the transformed response signal RS in the phase space. Transforming the response signal RS from the time space into the phase space means that the time axis is stretched. In other words, the response signal RS is sampled with a constant sampling rate, thereby yielding sampling values si (with i=1, 2, . . . ). Due to the constant sampling rate the number of sampling values si per period of the response signal RS decreases with the increase of the frequency. For instance, when the frequency of the response signal RS is about 100 Hz, ten sampling values s1-s10 are taken within one period of the signal (assuming 1000 samples are taken per second). When the frequency of the response signal reaches about 333.33 Hz, only three sampling values s30-s32 are taken within one period. Strictly speaking, due to the continuous frequency change the number of sampling values changes already within fractions of one period.

It should be appreciated that the digital signal processor 4 is adapted to not only measure the amplitudes of the sampling values si, but also to allocate the correct phase to each sampling value si. To ease understanding of the invention it should be noted that transformation of the response signal RS from the time space into the phase space can be imagined as plotting the amplitudes of the sampling values si against the phase resulting in a transformed response signal TRS that is a pseudo sine wave signal with constant periods, i.e. with an invariant frequency. This is mathematically equivalent to weighting each sample value si with the current frequency of the input signal IS. In the present example of FIGS. 3 and 4, the weighting of the sample values s1-s10 taken at about 100 Hz (i.e. between 99 Hz and 101 Hz) is 1/10 (since ten samples values have been taken) and the weighting of the sample values s30-32 taken at about 333.33 Hz (e.g. between 332.33 Hz and 334.33 Hz) is 1/3 (since merely three samples values have been taken at that frequency band). Generally the rule can be set that the higher the frequency the higher the weight of the sample value si.

By means of this weighted signal, a Fourier analysis of defined subranges of the transformed response signal can be carried out in a reasonable manner. The subranges SR100, SR333, SRi can e.g. be defined as one or more periods of the response signal RS. It will be appreciated that in this case the width of the subranges SR100, SR333, SRi will decrease with increasing frequency of the response signal RS in the time space (see FIG. 3), but will remain constant in the phase space (see FIG. 4).

Each subrange SRi can suitably be described by allocating a nominal frequency fn100, fn333 . . . fni to each subrange SRi. The nominal frequency fni can be determined as the center frequency (e.g. 100 Hz, 333.33 Hz) between the boundary frequencies (99 Hz, 101 Hz and 332.33 Hz, 334.33 Hz, respectively) of the subranges SR100, SR333, SRi. The Fourier analysis of the phase space transformed response signal (TRS) is then carried out at said nominal frequencies (fn100 . . . fni).

In order to minimize the calculation time, it is, however, more suitable to establish reference functions when defining the input signal IS, and to use these reference functions to perform the Fourier transform via numerical integration.

If the response signal RS is weighted, the reference functions are sine functions with integral multiples of the frequency of the input signal IS, according to the general formulas for the amplitudes $a_n(\omega)$, $b_n(\omega)$:

$$a_n(\omega) = \int x(t) k(t) \sin(n\omega t)$$

$$b_n(\omega) = \int x(t) k(t) \cos(n\omega t)$$

with n=1, 2, 3 . . .

wherein k(t) is a scale factor being known in advance and the products [k(t) sin(nωt)] and [k(t) cos(nωt)] being the reference functions which can be calculated in advance, since all the factors appearing in theses products are already known. The signal x(t) in the above formulas corresponds to the signal RS in FIG. 3. The multiplication [x(t) k(t)] is equivalent to a transformation from the time space into the phase space.

For example, a set of reference functions could be used comprising a basic frequency and the first five harmonic frequencies of this basic frequency, wherein the basic frequencies correspond to the nominal frequencies of the subranges of the response signal RS and the transformed TRS, respectively, mentioned above.

In order that weighting for the response signal RS does not have to be carried out during each measurement, the reference functions can be weighted as they are being established. This calculation step after the measuring operation can thus be omitted. The advantage of weighting the reference function, however, emerges only if several measurements are carried out with the same predefined input signal IS. Therefore, this is especially useful during checkups in production of e.g. electro-acoustic devices.

The advantages of the invention can be summarized as follows:
- only one measuring operation for determining all essential portions of the response signal RS is needed;
- the shortest possible input signal IS can be used;
- with the aid of the weighted reference functions, the calculation effort is kept at a minimum;
- due to the continuous frequency change of the input signal IS, resonances with very high Q factors cannot easily be overlooked;
- far better adjustment to manufacturing conditions because of short measurement and calculation times.

It should be observed that the invention can also be carried out by transforming the reference functions into the time space and using them there for the Fourier transform of the response function, instead of transforming the response signal RS into the phase space, since this is a mathematically analog operation, as is well known to those skilled in applied mathematics.

The inventive method may be embedded in form of either hardware or by the aid of software executable by the digital signal processor 4.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. Use of the verb "comprise" and its conjugations do not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A method of determining the harmonic and anharmonic portions of a response signal of a device, comprising the steps of:
   supplying an input signal to the device causing the device to respond with a response signal, wherein the input signal is a sinusoidal signal having a continuously increasing or decreasing frequency;
   capturing the response signal;
   transforming the captured response signal from the time space into the phase space; and
   analyzing the phase space transformed response signal in respect of its harmonic and/or anharmonic portions.

2. The method according to claim 1, wherein analyzing the phase space transformed response signal in respect of its harmonic and anharmonic portions comprises carrying out a Fourier analysis of subranges of the phase space transformed response signal.

3. The method according to claim 2, wherein a nominal frequency is allocated to each subrange of the phase space transformed response signal and the Fourier analysis of the phase space transformed response signal is carried out at said nominal frequencies.

4. The method according to claim 3, wherein a center frequency of the subrange of the phase space transformed response signal is determined as said nominal frequency.

5. The method according to claim 1, wherein transforming the captured response signal from the time space into the phase space comprises sampling the response signal at a constant sampling rate and weighting the sample values with the input signal.

6. An apparatus for determining the harmonic and anharmonic portions of a response signal of a device, the apparatus comprising:
   a signal generator configured to supply an input signal to the device causing the device to respond with a response signal, wherein the input signal is a sinusoidal signal having a continuously increasing or decreasing frequency; and
   a digital signal processor configured to capture the response signal, transform the captured response signal from the time space into the phase space, and analyze the phase space transformed response signal in respect of its harmonic and/or anharmonic portions.

7. A method of determining the harmonic and anharmonic portions of a response signal of a device, comprising the steps of:
   supplying an input signal to the device causing the device to respond with a response signal, wherein the input signal is a sinusoidal signal having a continuously increasing or decreasing frequency;
   capturing the response signal;
   establishing reference functions when defining the input signal; and
   analyzing the response signal by Fourier transformations carried out by numerical integrations of the reference functions.

8. The method according to claim 7, wherein the reference functions are sine functions with integral multiples of the frequency of the input signal.

9. The method according to claim 8, wherein the reference functions are weighted as they are being established.

10. An apparatus for determining the harmonic and anharmonic portions of a response signal of a device, the apparatus comprising:
    a signal generator configured to supply an input signal to the device causing the device to respond with a response signal, wherein the input signal is a sinusoidal signal having a continuously increasing or decreasing frequency; and
    a digital signal processor connected to the signal generator and configured to capture the response signal,
    wherein the digital signal processor is further configured to control the signal generator, define the input signal, establish reference functions when defining the input signal, and analyze the response signal by Fourier transformations carried out by numerical integrations of the reference functions.

* * * * *

UNITED STATES PATENT AND TRADEMARK OFFICE
CERTIFICATE OF CORRECTION

PATENT NO. : 8,396,227 B2  Page 1 of 1
APPLICATION NO. : 12/513867
DATED : March 12, 2013
INVENTOR(S) : Josef Lutz It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 539 days.

Signed and Sealed this

First Day of September, 2015

Michelle K. Lee
*Director of the United States Patent and Trademark Office*